US008280561B2

(12) United States Patent
Griggs et al.

(10) Patent No.: US 8,280,561 B2
(45) Date of Patent: Oct. 2, 2012

(54) POWERED WHEELCHAIR

(75) Inventors: Gerald Thomas Griggs, Scarborough (CA); Tilak Dutta, Sudbury (CA); Geoffrey Roy Fernie, Etobicoke (CA)

(73) Assignee: University Health Network, Toronto, Ontario (CA)

( * ) Notice: Subject to any disclaimer, the term of this patent is extended or adjusted under 35 U.S.C. 154(b) by 422 days.

(21) Appl. No.: 12/585,250

(22) Filed: Sep. 9, 2009

(65) Prior Publication Data

US 2010/0082182 A1 Apr. 1, 2010

Related U.S. Application Data

(60) Provisional application No. 61/136,492, filed on Sep. 9, 2008.

(51) Int. Cl.
*G06F 19/00* (2006.01)
*B62D 11/04* (2006.01)
*H03K 17/94* (2006.01)

(52) U.S. Cl. ........ 701/1; 180/65.31; 180/400; 180/19.3; 180/6.38

(58) Field of Classification Search ............... 137/636.2; 701/1; 180/65.1, 323, 19.1, 6.1, 21, 65.31, 180/400, 19.3, 6.38, 6.32; 74/471 XY; 5/86.1, 5/81.1 R, 600; 341/34; 345/161
See application file for complete search history.

(56) References Cited

U.S. PATENT DOCUMENTS 3,776,058 A * 12/1973 French ..................... 74/471 XY
5,445,233 A 8/1995 Fernie et al.
5,692,541 A * 12/1997 Brown ....................... 137/636.2
6,169,479 B1 1/2001 Boran et al.
6,179,076 B1 1/2001 Fernie et al.
6,209,670 B1 4/2001 Fernie et al.
6,580,418 B1 * 6/2003 Grome et al. ................. 345/161
6,842,692 B2 1/2005 Fehr et al.
7,104,354 B2 9/2006 Ozaki
7,243,746 B1 * 7/2007 Vasant ........................... 180/6.5
2003/0107502 A1 * 6/2003 Alexander et al. .............. 341/34
2004/0220735 A1 11/2004 Adams
2005/0279551 A1 12/2005 Lopresti
2008/0223649 A1 * 9/2008 Wandeler ...................... 180/333

FOREIGN PATENT DOCUMENTS

CA 2150163 2/1996

(Continued)

OTHER PUBLICATIONS

Wang, R.H., Holliday, P.J., & Fernie, G.R. (2009). Power mobility for a nursing home resident with dementia. American Journal of Occupational Therapy, 63(6), 765-771.

(Continued)

*Primary Examiner* — Ronnie Mancho

(57) ABSTRACT

A powered wheel chair device comprises a motorized undercarriage and a support seat for supporting a wheelchair occupant. At least one support arm is located adjacent the seat. A controller is mounted on the arm, the controller including a joystick unit within reach of the occupant. The joystick is in communication with the motorized undercarriage for driving the undercarriage. The joystick includes an upstanding post with a collar, the collar having a periphery with a number of abutment regions located therealong. A number of actuators are provided, each movable from a storage position distal to the corresponding abutment region and a deployed position adjacent the corresponding abutment region. Each actuator is responsive to an obstacle detecting sensor near a corresponding peripheral region of the undercarriage.

20 Claims, 9 Drawing Sheets

FOREIGN PATENT DOCUMENTS

| | | |
|---|---|---|
| CA | 2249515 | 4/2000 |
| CA | 2289245 | 5/2000 |
| EP | 1119330 | 8/2001 |
| GB | 2305899 | 4/1997 |
| WO | WO-00/19958 | 4/2000 |

OTHER PUBLICATIONS

Wang, R. H. et al. The experiences of . . . care residents with mild cognitive impairment. Disability and Rehabilitation: Assistive Technology. 1-17, 2010.
Wang, R. H., et al. Evaluation of a contact sensor skirt for an anti-collision power wheelchair for older adult nursing home residents with dementia. (in press).
Wang, R. H., et al.Usability testing of a multimodal . . . collision-avoidance for long term care home residents with cognitive impairments, J Rehab Res and Develp. (under review).
Brienza, David M. and Angelo, Jennifer. A force feedback joystick and control algorithm for wheelchair obstacle avoidance, Disability & Rehabilitation,18:3,123-129, 1996.
Ko, A-K and Choi J-Y. A haptic interface using a force-feedback joystick. SICE Annual Conference, Sep. 17-20, 2007, Kagawa Univeristy, Japan. 202-207, 2007.
Linda Fehr, et al. Adequacy of power wheelchair control interfaces for persons with severe disabilities: A clinical survey. J Rehabil and Dev. vol. 37, No. 3: 353-360, 2000.
Dicianno BE, et al. Advancements in power . . . on driving performance. Advances in Power Wheelchair Interfaces. 631-639, 2006.
Bourhis G, et al. Assisted control . . . wheelchair. Proceedings of the 2007 IEEE 10th International Conference on Rehabilitation Robotics, Jun. 12-15, Noodwijk. 158-163, 2007.
Cooper, RA, et al. Comparison of virtual and real electric powered wheelchair driving using a position sensing joystick. Medical Engineering and Physics. 24:703-708, 2002.
Spaeth DM, et al. Development of a wheelchair virtual driving environment: trials with subjects with taumatic brain injury. Arch Phys Med Rehabil. vol. 89, 996-1003, 2008.
Shino M, et al. Development of Electric Wheelchair with . . . Detecting Interface for Persons with Becker's Muscular Dystrophy. Ergonomics and Health Aspects. 4566: 309-318, 2007.
Souayah N, Sander HW: Lumbosacral magnetic root stimulation in lumbar plexopathy. Am J Phys Med Rehabil 2006;85:858-861.
A. Fattouh, M. Sahnoun and G. Bourhis. Force Feedback Joystick Control of a Powered Wheelchair: Preliminary Study. IEEE 2004.
Luo, et al. Force Reflective Feedback Control for Intelligent Wheelchairs. Proceedings of the 1999 IEEV/RSJ International Conference on Intelligent Robot and Systems. 918-923.
Crespo LM, Reinkensmeyer DJ. Haptic Guidance Can Enhance Motor Learning of a Steering Task. Journal of Motor Behavior vol. 40, No. 6, 545-556, 2008.
Dicianno BE, Sibenaller S, Kimmich C, Cooper RA, Pyo J. Joystick use for virtual power wheelchair . . . individuals with tremor: Pilot study. JRRD. Vo 46, No. 2:269-276, 1999.
G. Bourhis and Y. Agostini. Man-machine Cooperation for the Control of an Intelligent Powered Wheelchair. Journal of Intelligent and Robotic Systems 22: 269-287, 1998.
Kondo Y, et al. Navigation Guidance . . . Avoidance of Omni-directional Wheelchair. Symposium on Haptic interface for Virtual Environments and Teleoperator Systems. 437-444: 2008.
Pellegrini N, et al. Optimization of power wheelchair control for patients with severe Duchenne muscular dystrophy. Neuromuscluar Disorders 14; 297-300, 2004.
Ding D, Cooper RA, Spaeth D. Optimized joystick controller. Proceedings of the 26th Annual International Conference of the IEEE EMBS San Francisco, CA, USA, Sep. 1-5, 2004.
Protho JL,Lopresti BS, Brienza DM. An evaluation of an obstacle avoidance force feedback joystick. The Proceedings of the Annual RESNA Conference. Orlando, FL, Jun. 28-Jul. 2.
Nilsson L, Nyberg P. Single-switch control versus powered wheelchair for training cause-effect relationships: case studies, Technology and Disability 11 (1999) 35-38.
Letts, L. et al., Development of the Power-mobility Community Driving Assessment. Canadian Journal of Rehabilitation, 1998. 11(3): p. 123-129.
Nitz, J.C., Evidence from a cohort of able bodied adults . . . participation. Patient Education and Counseling, 2008. 70: p. 276-280.
Bourret, E., et al., The meaning of mobility for residents and staff in long-term care facilities. Journal of Advanced Nursing, 2002. 37(4): p. 338-345.
Simpson, R.C., Smart wheelchairs: A literature review. Journal of Rehabilitation Research & Development, 2005. 42(4): p. 423-435.
Carswell A., et al. The Canadian Occupational Performance Measure: a research and clinical literature review.Canadian Journal of Occupational Therapy 2004; 71(4): 210-222.
Dutta T., et al. Utilization of . . . of Powered Wheelchairs. IEEE Transactions on Neural systems and Rehabilitation Engineering. 2005; 13(1): 24-32.
Hall K., et al. Power mobility driving training for seniors: a pilot study. Assistive Technology. 2005; 17(1)27-36.
Holliday P., et al. Understanding . . . Powered Wheelchair Mobility and Manoeuvrability. Part I. Reach in Confined Spaces.Disability and Rehabilitation. 2005;27(16):939-49.
Jutai J., et al. Toward a taxonomy of assistive technology device outcomes. American Journal of Physical Medicine and Rehabilitation 2005, 84(4):294-302.

* cited by examiner

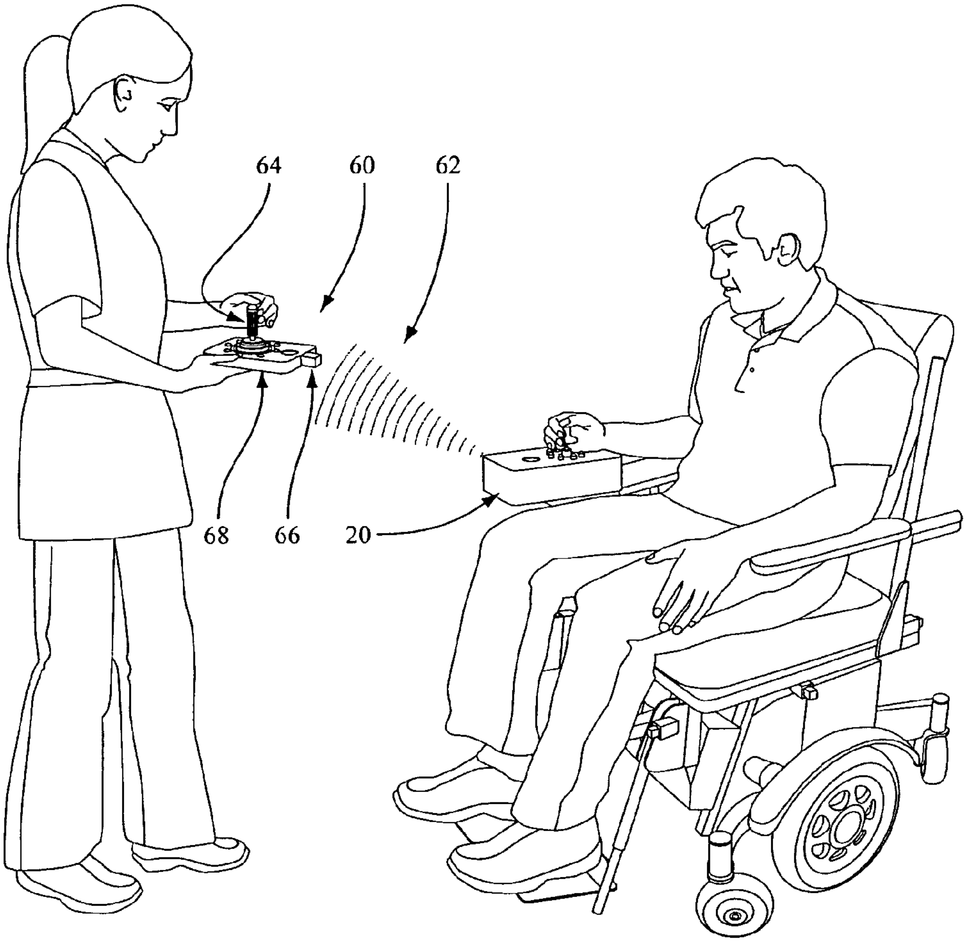
Figure 6
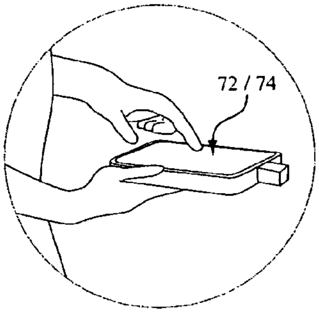
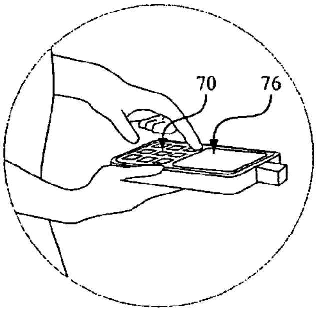
Figure 6a
Figure 6b

POWERED WHEELCHAIR

REFERENCE TO COPENDING APPLICATIONS

The entire subject matter of U.S. Provisional application 61/136,492 filed Sep. 9, 2008 and entitled POWERED WHEELCHAIR is incorporated herein by reference. The applicant claims priority benefit under Title 35, United States Code, Section 19 of the above application.

FIELD OF THE INVENTION

The present invention relates to collision avoidance for powered wheelchairs.

DESCRIPTION OF THE RELATED ART

Powered mobility training is essential to safe and skilled driving [1]. Training is provided in an attempt to minimize unsafe power wheelchair use and enable effective power wheelchair driving performance. Powered wheelchair mobility training is routinely provided to new users and offered to users who experience a change in their ability to drive. Training has been found to be helpful for unimpaired users of powered mobility devices [2]. Users who have not received training report driving incidents and accidents related to driving [1]. Users who receive training have a higher retention rate for device use.

Independent mobility is an essential factor in the quality of life of individuals living in institutions [3]. Many residents who are physically unable to move a manual wheelchair and who have cognitive impairments do not have the option of using a powered wheelchair due to the risk of injury to themselves and others. A particular safety concern relates to driving in an environment where others who may be at high risk for falls are walking. Current interventions to improve safety and independent powered wheelchair mobility tend to be limited. Despite the many innovative technologies involving smart or robotic collision avoidance systems under development, very few have been tested with clinical populations in the real world setting [4]. In many cases, these residents remain dependent on their caregivers to move them from place to place.

SUMMARY OF THE GENERAL INVENTIVE CONCEPT

In an exemplary embodiment, there is provided a powered wheel chair device, comprising a motorized undercarriage and a support seat for supporting a wheelchair occupant. At least one support arm is located adjacent the seat. A controller is mounted on the arm, the controller including a joystick unit within reach of the occupant. The joystick is in communication with the motorized undercarriage for driving the undercarriage. The joystick includes an upstanding post with a collar, the collar having a periphery with a number of abutment regions located therealong. A number of actuators are provided, each movable from a storage position distal to the corresponding abutment region and a deployed position adjacent the corresponding abutment region. Each actuator is responsive to an obstacle detecting sensor near a corresponding peripheral region of the undercarriage.

In some exemplary embodiments, the actuator includes a solenoid, and a blocking arm is pivotally mounted to a base portion. The blocking arm has a remote end region and is responsive to the solenoid for pivoting between the storage and deployed positions.

In some exemplary embodiments, the collar portion includes a plate member and each abutment portion includes a projection.

In some exemplary embodiments, the plate member includes a plurality of recesses, each recess being triangular in shape.

In some exemplary embodiments, the controller includes a signaling portion for issuing a signal to the occupant according to at least one operating condition.

In some exemplary embodiments, the signaling portion includes a plurality of LED units arranged to convey directional signals when activated.

Some exemplary embodiments further comprise a remote control unit operable for establishing a wired or wireless data path with the controller.

In some exemplary embodiments, the remote control unit including a remote joystick, and a remote signaling unit for conveying directional messages over the data path with the controller.

Some exemplary embodiments, further comprise a remote joystick positioning unit for positioning the remote joystick, the signaling unit operable for receiving directional messages over the data path from the controller according to a current position on the joystick, the remote joystick positioning unit responsive to the signaling unit to synchronize an operative position of the remote joystick with the joystick.

In some exemplary embodiments, the remote control unit include one or more activators which are communicate with the signaling unit to convey directional messages over the data path, the controller being responsive to the directional messages to activate one or more actuators to limit travel of the joystick.

In some exemplary embodiments, the actuators are provided by a touch pad, a touch screen or and/or keyboard.

In another exemplary embodiment, there is provided a kit for retrofitting a powered wheel chair device of the type having a motorized undercarriage, a seat for supporting a wheelchair occupant, at least one support arm located adjacent the seat, a controller mounted on the arm, the controller including a joystick unit within reach of the occupant, the joystick including an upstanding post and being in communication with the motorized undercarriage for driving the undercarriage. The kit comprises a collar for attachment to the upstanding post. The collar has a periphery with a number of abutment regions located therealong. An equal number of actuators are also provided, each of which are mounted on a base portion and movable from a storage position distal to the corresponding abutment region and a deployed position adjacent the corresponding abutment region. Each actuator is responsive to an obstacle detecting sensor near a corresponding peripheral region of the undercarriage.

In another exemplary embodiment, there is provided a method for controlling a powered wheel chair device of the type having a motorized undercarriage, a support seat for supporting a wheelchair occupant, at least one support arm located adjacent the seat, a controller mounted on the arm, the controller including a joystick unit within reach of the occupant, the joystick including an upstanding post and being in communication with the motorized undercarriage for driving the undercarriage. The method further comprises providing a collar member for attachment to the upstanding post. The collar member is provided with a periphery including a number of abutment regions located therealong. An equal number of actuators are provided, each mounted on a base portion and movable from a storage position distal to the corresponding abutment region and a deployed position adjacent the corresponding abutment region. Each actuator is configured to be responsive to an obstacle detecting sensor near a corresponding peripheral region of the undercarriage, so that when the corresponding sensor detects an obstacle, the abutment member moves to the deployed position, thereby presenting a barrier against travel of the joystick in the direction of the barrier.

In another exemplary embodiment, there is provided a device for a powered wheel chair, comprising a joystick portion for mounting within reach of an occupant. A switch portion is operably coupled with the joystick portion to registering changes in orientation of the joystick according to desired movements of the occupant. The switch portion includes a signal output portion for conveying operative signals to a drive motor onboard the wheel chair. The switch portion includes a signal input portion for receiving abutment signals from one or more proximity detectors positioned on the wheel chair. The joystick includes an upstanding post with a number of abutment regions associated therewith. A number of actuators are also provided, each movable from a storage position distal to the corresponding abutment region and a deployed position adjacent the corresponding abutment region. Each actuator is responsive to a corresponding sensor, for inhibiting travel of the joystick in a direction of an object sensed by the corresponding sensor.

In another exemplary embodiment, there is provided a method of controlling a powered wheel chair device, comprising providing a joystick for location within reach of an occupant. The method includes establishing communication between the joystick and a switch unit for registering changes in orientation of the joystick according to desired movements of the occupant, configuring the switch unit to convey a signal to a drive motor onboard the wheel chair device, configuring the switch unit to receive a signal from one or more detectors which are operable to register at least one alarm condition when the powered wheel chair device is below a predetermined safe distance from an obstacle, providing a plurality of abutment portions, each for interrupting a portion of a travel path of joystick, and actuating one of the abutment portions when the switch portion registers a corresponding alarm condition.

In yet another exemplary embodiment, there is provided a controller device for a powered vehicle, comprising a switch portion operably coupled with an onboard directional control portion. The switch portion is operable to register changes in orientation of the directional control portion according to desired movements of the occupant. The switch portion includes a signal output portion for conveying operative signals to a drive motor onboard the vehicle. The switch portion also includes a signal input portion for receiving abutment signals from one or more proximity detectors positioned on the vehicle. The directional control portion includes a number of abutment regions associated therewith and a number of actuators are provided, each movable from a storage position distal to the corresponding abutment region and a deployed position adjacent the corresponding abutment region. Each actuator is responsive to a corresponding sensor, for inhibiting travel of the directional control portion in a direction of an object sensed by the corresponding sensor.

In some exemplary embodiments, the directional control portion includes a joystick.

In still another exemplary embodiments, there is provided a method of controlling a powered vehicle. First, a switch unit is provided for registering changes in orientation of a directional control portion in the vehicle according to desired movements of the occupant, Next, the switch unit is configured to convey a signal to a drive motor onboard the vehicle.

The switch unit is configured to receive a signal from one or more detectors which are operable to register at least one alarm condition when the vehicle is below a predetermined safe distance from an obstacle. A plurality of abutment portions is provided, each for interrupting a portion of a travel path of the directional control portion. One of the abutment portions is actuated when the switch portion registers a corresponding alarm condition.

BRIEF DESCRIPTION OF THE DRAWINGS

Several preferred embodiments of the present invention will be provided, by way of examples only, with reference to the appended drawings, wherein:

FIG. 6 is a perspective operational view of the wheel chair in a learning mode using a remote joystick;

FIGS. 6*a* and 6*b* are fragmentary perspective operational views of alternatives to the joystick of FIG. 6.

DESCRIPTION OF THE PREFERRED EMBODIMENTS

Figure 1:
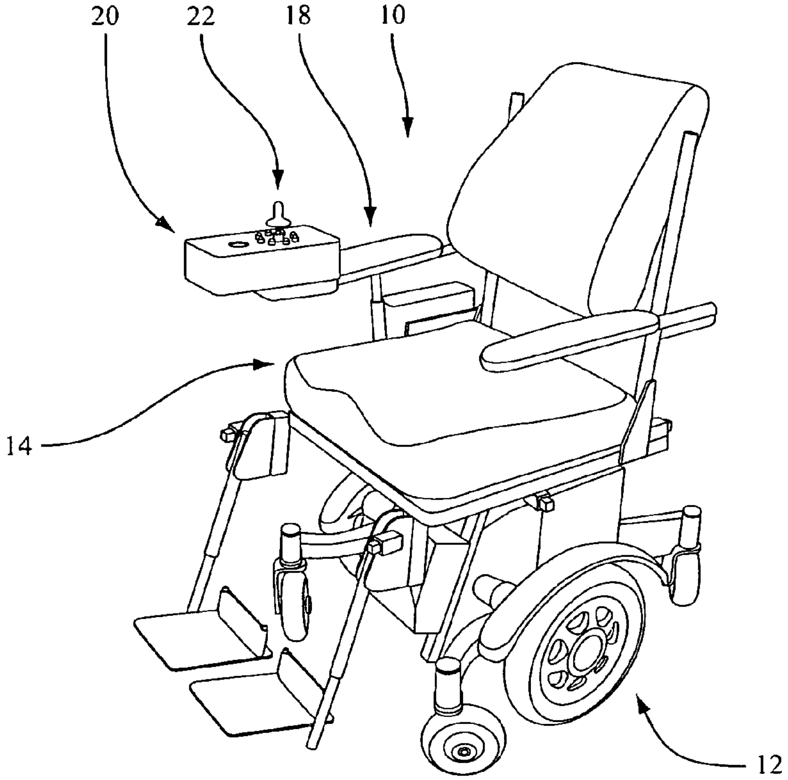
FIG. 1 is a schematic side view of a motorized wheel chair.
Figure 1A:
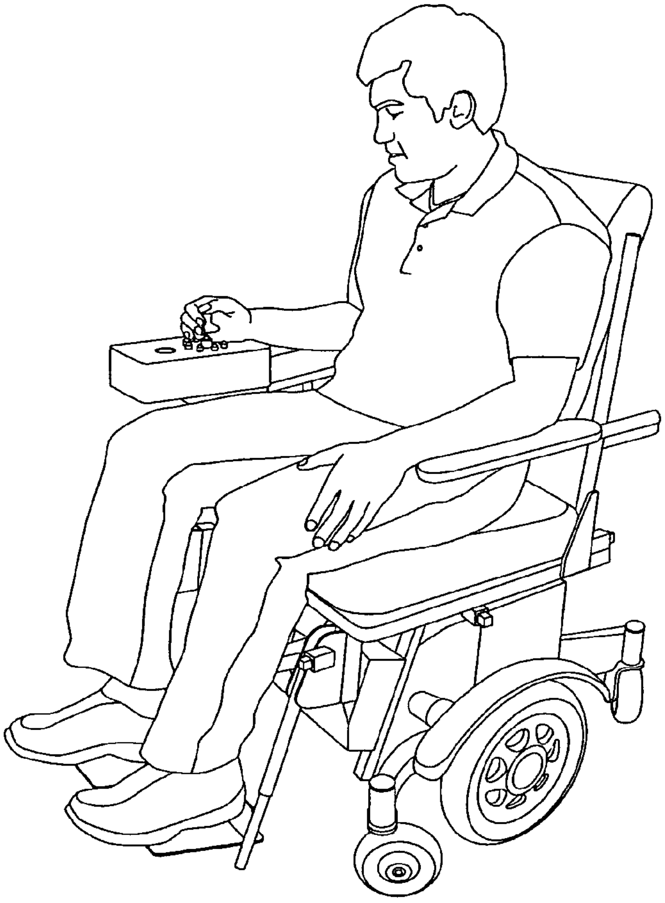
FIG. 1*a* is a schematic view of a motorized wheel chair with an occupant.
Figure 2:
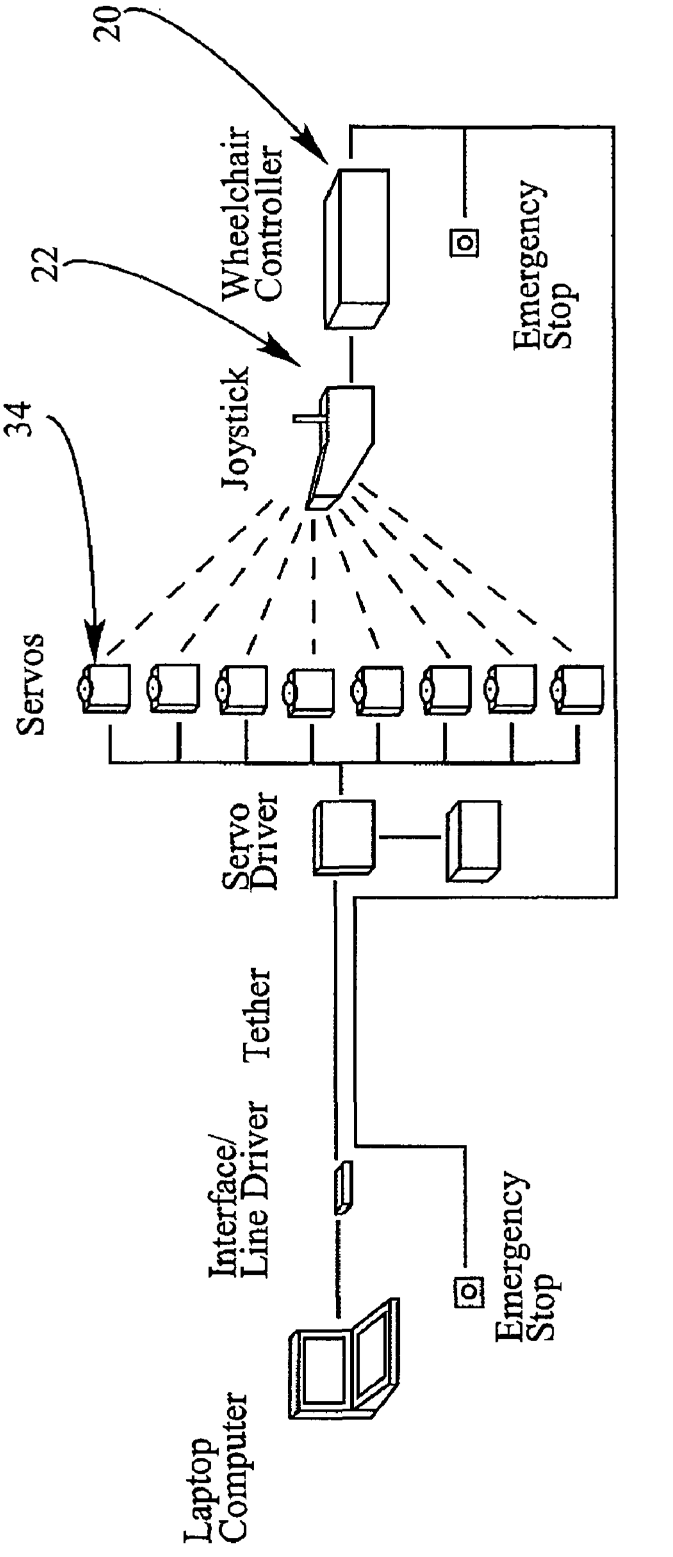
FIG. 2 is a schematic view of a wheel chair joystick control system.

It should be understood that the invention is not limited in its application to the details of construction and the arrangement of components set forth in the following description or illustrated in the drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings. In addition, the terms "connected" and "coupled" and variations thereof are not restricted to physical or mechanical connections or couplings. Furthermore, and as described in subsequent paragraphs, the specific mechanical, electrical or other configurations illustrated in the drawings are intended to exemplify embodiments of the invention. However, other alternative mechanical, electrical or other configurations are possible which are considered to be within the teachings of the instant disclosure. Furthermore, unless otherwise indicated, the term "or" is to be considered inclusive.

Figure 7:
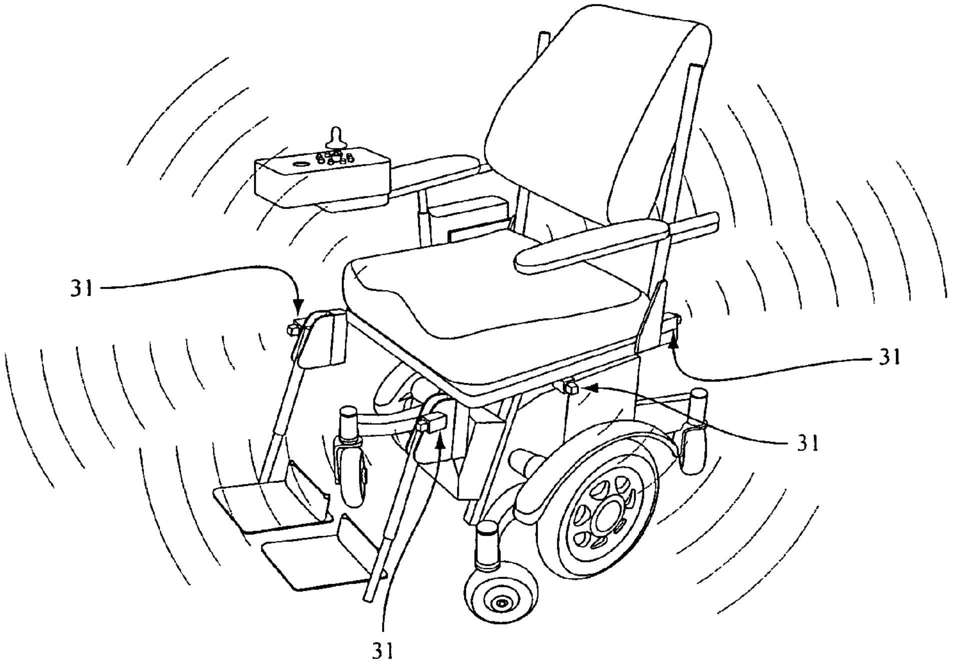
FIGS. 7 and 8 are perspective operational views of the wheel chair in different operational modes.
Figure 8:

As is shown in the figures, there is provided a powered wheel chair device 10, comprising a motorized undercarriage 12 and a support seat 14 for supporting a wheelchair occupant. At least one support arm 18 is located adjacent the seat 14 and a controller 20 is mounted on the arm. The controller includes a joystick 22 within reach of the occupant. The joystick 22 is in communication with the motorized undercarriage 12 for driving the undercarriage 12. The joystick 22 includes an upstanding post 24 which is, in this example, formed of piano spring wire. The post 24 includes a joystick plate or collar 26. The collar has a periphery with a number of abutment regions 30 located therealong. An equal number of actuators 32 are also provided, each movable between a storage position distal to the corresponding abutment region 30 and a deployed position adjacent the corresponding abutment region 30. Each actuator 32 is responsive to an obstacle detecting sensor, as shown at 31 in FIG. 7, near a corresponding peripheral region of the undercarriage 12.

The actuator 32 includes a solenoid 34 and a blocking bar or arm 36 is pivotally mounted to a base portion 38. A cover portion 39 is also fixed to the base portion 38. In this example, the base portion 38 is part of a retrofit kit and has a central gap 40 to receive the controller 20 therein, thus allowing the kit to be applied to the controller of existing motorized wheel chairs.

Figure 4:
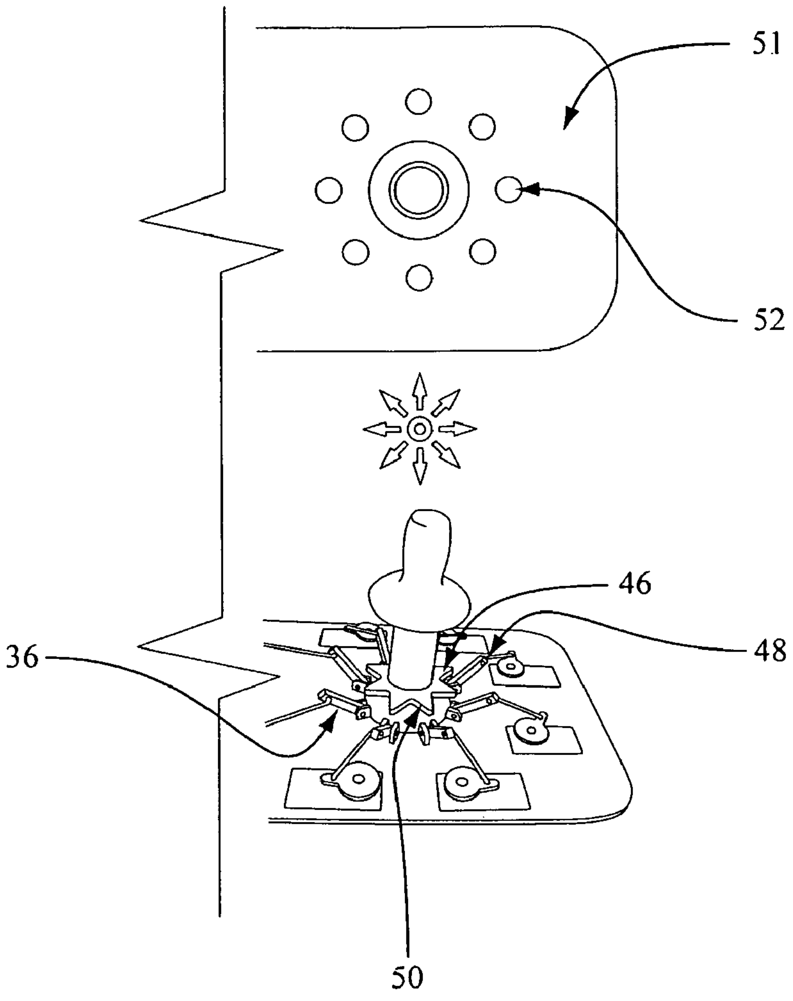
FIG. 4 is a perspective operational view of the joystick control system in one operable mode.
Figure 5:
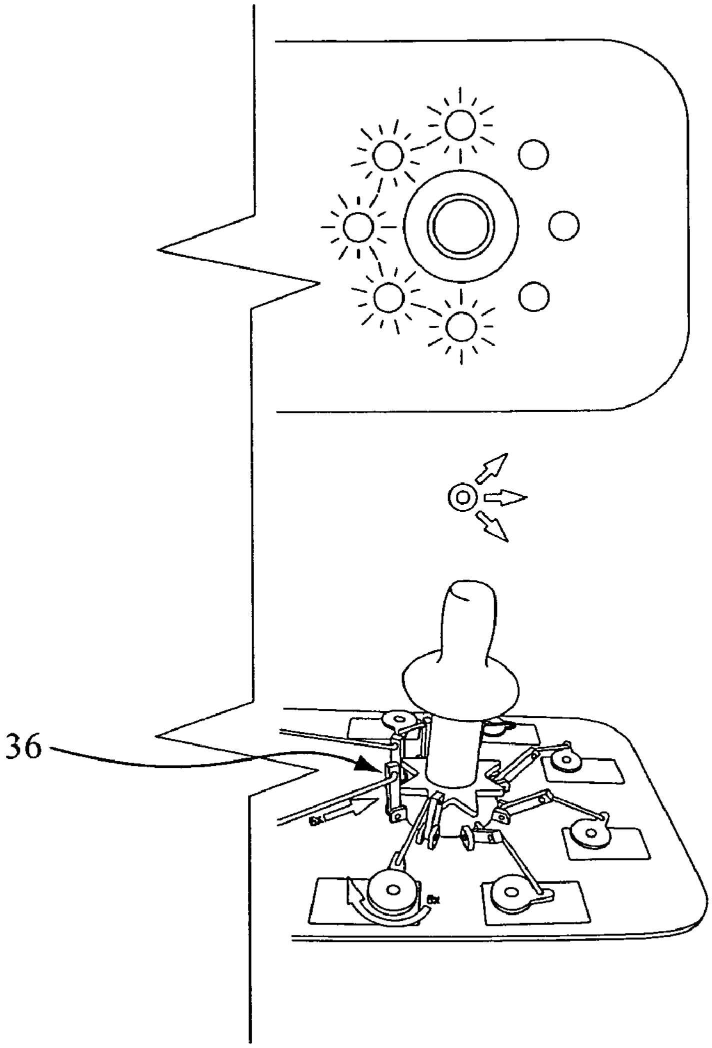
FIG. 5 is a perspective operational view of the joystick control system in another operable mode.

The blocking arm 36 has a remote end region and is responsive to the solenoid 34 for pivoting between the storage position (as shown for each blocking arm in FIG. 4) and the deployed position (as shown in FIG. 5 for selected blocking arms). In this case, the actuator 32 may also take the form of a servo motor 34 with an output drive member 42 with a remote end **42*a*. A link 44 joins the remote ends of the blocking arm 36 and output drive member 42** respectively.

Figure 3:
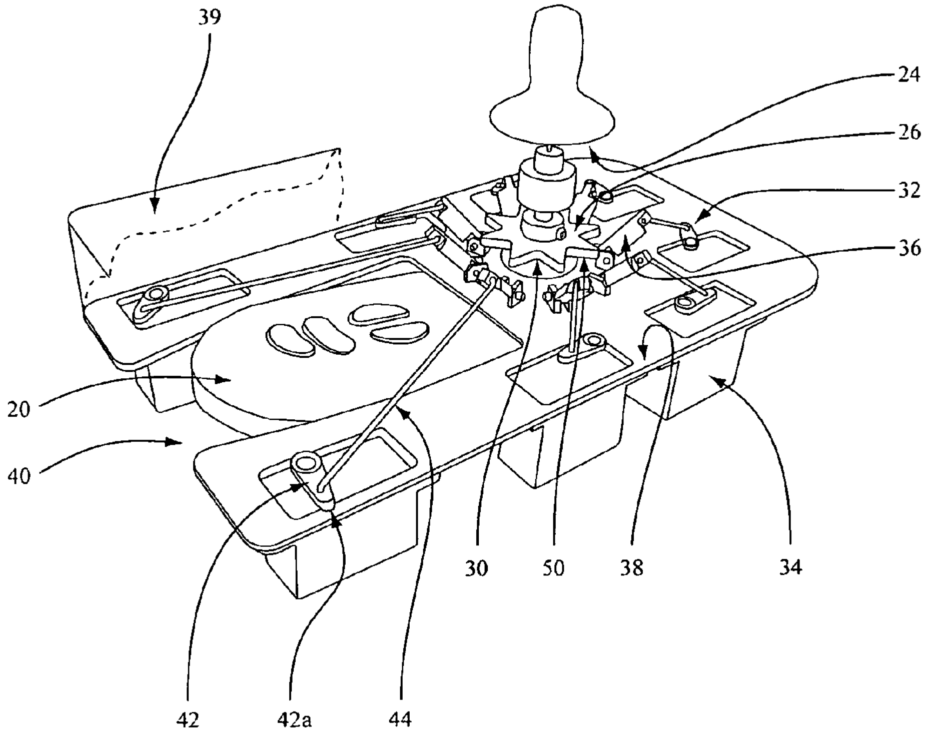
FIG. 3 is a perspective view of a portion of the joystick control system shown in FIG. 1.

The collar portion includes a plate member 46 with a plurality of abutment portions 48. Each abutment portion includes a projection 50. The projection 50, in the example illustrated is triangular in shape, though other shapes may also be employed as desired. In this case, the blocking arms are configured to be in contact with or adjacent the plate member. In the example of FIG. 3, the blocking arm has a cross section which is triangular so as to be complementary in shape with the triangular region between neighbouring pairs of projections 50. In this example of FIGS. 4 and 5, the blocking arm has a cross section which is dimensioned to fit between adjacent projections 50, but itself is not triangular in cross section. If desired, the blocking arm may cooperate with the projection in other ways, such as by being aligned with a corresponding projection as opposed to be aligned with a region between neighbouring projections. Thus, the projection 50 includes an outer end region and each of the blocking arms 36 is aligned with a region between adjacent projections or with a corresponding projection itself to engage the outer region. This may occur in the deployed position or alternatively following arrival at the deployed position, when an occupant attempts to direct the joystick in the direction of the blocking arm 36 in question, thereby presenting a barrier to displacement, or further displacement in the given direction. Alternatively, the collar may be configured with the blocking arms in other ways to allow the latter to block the travel of the joy stick.

As can be seen in FIGS. 4 and 5, the controller includes a signaling portion 51 for issuing a signal to the occupant according to at least one operating condition. In this case the signaling portion includes a plurality of LED units 52 arranged to convey directional signals when activated, but may also include audio signals such as voice, tones, bells, or vibratory signals.

In another example as shown in FIG. 6, a remote control unit 60 is provided which is operable for establishing a wired or wireless data path 62 with the controller 20. In this case, the remote control unit 60 includes a remote joystick 64, and a remote signaling unit 66 for conveying directional messages over the data path 62 with the controller 20.

In an example, the remote joystick 64 is provided with a positioning unit 68 for positioning the remote joystick, the signaling unit 66 operable for receiving directional messages over the data path 62 from the controller 20 according to a current position on the joystick 22. In this case, the positioning unit 68 is responsive to the signaling unit 66 to synchronize an operative position of the remote joystick 64 with the joystick 20.

In another example, the remote control unit 64 includes one or more activators 70 which are communicate with the signaling unit 66 to convey directional messages over the data path 62. In this case, the controller 20 is responsive to the directional messages to activate one or more actuators 32 to limit travel of the joystick 22. In this case, actuators may be provided by a touch pad 72, a touch screen 74 or and/or keyboard 76.

If desired, the powered wheelchair device 10 may be assembled with the controller 20 integrally formed therein. Alternatively, the controller 20 may be provided as a kit for retrofitting a powered wheel chair device of the type having a motorized undercarriage, a support seat for supporting a wheelchair occupant, at least one support arm located adjacent the seat, with a controller mounted on the arm, the controller including a joystick unit within reach of the occupant, the joystick including an upstanding post and being in communication with the motorized undercarriage for driving the undercarriage. In this case, the kit may include a collar for attachment to the upstanding post, the collar having a periphery with a number of abutment regions located therealong, an equal number of actuators, each mounted on a base portion and movable from a storage position distal to the corresponding abutment region and a deployed position adjacent the corresponding abutment region, each actuator being responsive to an obstacle detecting sensor near a corresponding peripheral region of the undercarriage.

Also provided is a method for controlling a powered wheel chair device of the type having a motorized undercarriage, a support seat for supporting a wheelchair occupant, at least one support arm located adjacent the seat, a controller mounted on the arm, the controller including a joystick unit within reach of the occupant, the joystick including an upstanding post and being in communication with the motorized undercarriage for driving the undercarriage.

The method further includes providing a collar member for attachment to the upstanding post, providing the collar member with a periphery including a number of abutment regions located therealong, providing an equal number of actuators, each mounted on a base portion and movable from a storage position distal to the corresponding abutment region and a deployed position adjacent the corresponding abutment region, configuring each actuator to be responsive to an obstacle detecting sensor near a corresponding peripheral region of the undercarriage, so that when the corresponding sensor detects an obstacle, the abutment member moves to the deployed position, thereby presenting a barrier against travel of the joystick in the direction of the barrier.

It is intended that the device may be configured to fit on the joystick of a range of different powered wheel chairs, without the need to access or modify the wheelchair's proprietary electronics in any way and invalidating any warranty or regulatory approval.

Anti-collision mode: In one example, the controller 20 interfaces with the chair at the joystick. The controller 20 includes 8 radio controlled-type servo motors 34 mounted around the joystick's base. When activated, a servo motor 34 rotates the output drive member or small plate 42 which in turn moves the link or a bar 44 towards the joystick. The joystick is attached to or provided with a collar or plate 26 which interfaces with the bars 44. When a bar 44 is activated, the user cannot move the joystick in that direction, preventing the movement of the wheelchair in the same direction. The directions the wheelchair is not allowed to travel in are determined by software analyzing the status of an array of sensors mounted on the wheelchair.

If an object is in the path of the wheelchair, the servo motors preventing further movement towards the object will be engaged and only movement away from the object will be permitted. Prompting to assist and guide driving is accomplished as well by the software. The logic outputs a different audio prompt on a commercially available speaker mounted on the wheelchair e.g. "Go right". Other forms of audio prompting are possible and could include bells. Visual prompting in this prototype is accomplished through LEDs positioned around the base of the joystick, however many other options exist for visual feedback, such as a LCD screen. Tactile feedback may be provided by the limited movements of the joystick by the servo motors. Other tactile feedback could include vibration. Different forms of feedback may be customized, for example, to suit different users.

The joystick addition may be covered with a plastic case.

Training mode: In one example shown in FIG. 6, the interface may be used as an assessment and training tool for new and current users of powered wheelchairs to determine how well they respond to different prompts built into the device, cues from the therapist and environmental cues. This interface may include modular features that can be adapted, customized or modified for a dynamic and interactive training process.

In a training mode, for example, the same device may be used if a second joystick is added in closed loop feedback. The second joystick may be controlled by a trainer and overrides the driver's joystick for teaching powered wheelchair driving. If the learning driver moves the wheelchair in an inappropriate direction, the trainer may feel this incorrect action on the second joystick and make the corrective movement. The servo motors in turn may then move the driver's joystick in the correct direction to match the movement of the trainer's joystick. This progressive resistance on the joystick gives the driver haptic feedback to more easily learn the skills needed to drive the wheelchair. Feedback, for example as described above, may also be provided on the training device, again with for example visual and audio prompting.

If desired, in the Training mode, the joystick held by the caregiver/trainer may be replaced by a device used by a caregiver/trainer with one or more buttons to control the servo motors and limit the occupant/driver's joystick. For instance, the device may be a touch pad, a key board, or the like and may be could be connected to the wheelchair by a wired connection or wireless, such as radio frequency.

The present device may also be useful in training driving skills for other devices, such as a steering wheel in a car.

The blocking arms may, in other examples, slide rather than pivot. For instance, a solenoid piston itself may in some cases perform the role of the blocking arm to engage a corresponding abutment region. Alternatively, a solenoid, or other form of actuator, may be arranged to deploy more than one blocking arm.

The entire subject matter of each of the following references are incorporated herein by reference.

1. Letts, L., D. Dawson, and E. Kaiserman-Goldenstein, *Development of the Power-mobility Community Driving Assessment*. Canadian Journal of Rehabilitation, 1998. 11(3): p. 123-129.
2. Nitz, J. C., *Evidence from a cohort of able bodied adults to support the need for driver training for motorised scooters before community participation*. Patient Education and Counseling, 2008. 70: p. 276-280.
3. Bourret, E., et al., *The meaning of mobility for residents and staff in long-term care facilities*. Journal of Advanced Nursing, 2002. 37(4): p. 338-345.
4. Simpson, R. C., *Smart wheelchairs: A literature review*. Journal of Rehabilitation Research & Development, 2005. 42(4): p. 423-438.

While the present invention has been described for what are presently considered the preferred embodiments, the invention is not so limited. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

The invention claimed is:

1. A powered wheel chair device, comprising:
a motorized undercarriage;
a support seat for supporting a wheelchair occupant
at least one support arm located adjacent the seat,
a controller mounted on the arm, the controller including a joystick unit within reach of the occupant, the joystick being in communication with the motorized undercarriage for driving the undercarriage, the joystick including a collar having a periphery with a number of abutment regions located therealong;
obstacle detecting sensors peripherally positioned on the wheel chair; and
a number of actuators mounted relative to the collar and movable between a storage position distal to a corresponding abutment region and a deployed position adjacent the corresponding abutment region, each actuator being deployed responsive to a corresponding obstacle detecting sensor positioned near a corresponding peripheral region of the wheel chair for inhibiting travel of the joystick in a direction of an obstacle sensed by the corresponding sensor.

2. A device as defined in claim 1, the actuator including a solenoid, a blocking arm pivotally mounted to a base portion, the blocking arm having a remote end region, the blocking arm responsive to the solenoid for pivoting between the storage and deployed positions.

3. A device as defined in claim 2, the collar portion including a plate member, each abutment portion including a projection.

4. A device as defined in claim 3, the plate member including a plurality of recesses, each recess being triangular in shape.

5. A device as defined in claim 1, the controller including a portion for issuing a signal to the occupant according to at least one operating condition.

6. A device as defined in claim 5, the signaling portion including a plurality of LED units arranged to convey directional signals when activated.

7. A device as defined in claim 1, further comprising a remote control unit operable for establishing a wired or wireless data path with the controller.

8. A device as defined in claim 7, the remote control unit including a remote joystick, and a remote signaling unit for conveying directional messages over the data path with the controller.

9. A device as defined in claim 8, further comprising a remote joystick positioning unit for positioning the remote joystick, the signaling unit operable for receiving directional messages over the data path from the controller according to a current position on the joystick, the remote joystick positioning unit responsive to the signaling unit to synchronize an operative position of the remote joystick with the joystick.

10. A device as defined in claim 7, the remote control unit including one or more activators which are communicate with the signaling unit to convey directional messages over the data path, the controller being responsive to the directional messages to activate one or more actuators to limit travel of the joystick.

11. A device as defined in claim 10, the actuators being provided by a touch pad, a touch screen and/or a keyboard.

12. A device as defined in claim 1, each of the sensors configured to send an abutment signal to a corresponding actuator upon detecting that the wheel chair is below a predetermined safe distance from a given obstacle.

13. A device as defined in claim 1, wherein the sensors are positioned on the undercarriage.

14. A device as defined in claim 1, the sensors comprising proximity sensors.

15. A device as defined in claim 1, the actuators comprising radio controlled actuators.

16. A method for retrofitting a powered wheel chair device of the type having a motorized undercarriage, a support seat for supporting a wheelchair occupant, at least one support arm located adjacent the seat, and a controller mounted on the arm, the controller including a joystick unit within reach of the occupant, the joystick being in communication with the motorized undercarriage for driving the undercarriage, comprising:

providing a collar member for attachment to the joystick, the collar member having a periphery including a number of abutment regions located therealong;

providing a number of actuators mounted relative to the collar to be movable between a storage position distal to a corresponding abutment region and a deployed position adjacent the corresponding abutment region;

providing obstacle detecting sensors for peripheral positioning on the wheel chair; and configuring each actuator to be responsive to a corresponding obstacle detecting sensor near a corresponding peripheral region of the wheel chair, so that when the corresponding sensor detects an obstacle, the actuator is moved to the deployed position, thereby presenting a barrier against travel of the joystick in the direction of the barrier.

17. A kit for retrofitting a powered wheel chair device of the type having a motorized undercarriage, a support seat for supporting a wheelchair occupant, and a joystick unit within reach of the occupant, the joystick being in communication with the motorized undercarriage for driving the undercarriage, comprising:

obstacle detecting sensors to be peripherally positioned on the wheel chair;

a collar for attachment to the joystick, the collar having a periphery with a number of abutment regions located therealong;

actuators each to be mounted around the collar to be movable between a storage position distal to a corresponding abutment region of the collar and a deployed position adjacent to the corresponding abutment region, and configured to be deployed responsive to a corresponding obstacle detecting sensor sensing an obstacle near a corresponding peripheral region of the wheel chair so to inhibit travel of the joystick in a direction of the obstacle.

18. A kit as defined in claim 17, further comprising a collar for attachment to an upstanding post of the joystick, the collar defining along a periphery thereof each corresponding abutment region of the joystick.

19. A kit as defined in claim 17, the actuators comprising radio controlled actuators.

20. A kit as defined in claim 17, the sensors comprising proximity sensors.

* * * * *